US009454060B2

(12) United States Patent
Hamilton et al.

(10) Patent No.: US 9,454,060 B2
(45) Date of Patent: Sep. 27, 2016

(54) SEMICONDUCTOR DISK LASER FOR NONLINEAR MICROSCOPY APPLICATIONS IN LIVING ORGANISMS

(75) Inventors: Craig Hamilton, Glasgow (GB); Graeme Malcolm, Glasgow (GB); Ursula Keller, Uitikin-Waldegg (CH); Thomas Sudmeyer, Zurich (CH); Kurt Weingarten, Uitikon-Waldegg (CH); Pablo Loza-Alvarez, Castelldefels Barcelona (ES); Yohan Barbarin, Zurich (CH); Edik Rafailov, Dundee (GB)

(73) Assignee: The University of Dundee, Dundee (GB)

( * ) Notice: Subject to any disclaimer, the term of this patent is extended or adjusted under 35 U.S.C. 154(b) by 681 days.

(21) Appl. No.: 13/824,499

(22) PCT Filed: Sep. 19, 2011

(86) PCT No.: PCT/GB2011/001361
§ 371 (c)(1),
(2), (4) Date: Oct. 3, 2013

(87) PCT Pub. No.: WO2012/035307
PCT Pub. Date: Mar. 22, 2012

(65) Prior Publication Data
US 2014/0016185 A1    Jan. 16, 2014

(30) Foreign Application Priority Data

Sep. 17, 2010 (GB) .................................. 1015565.3

(51) Int. Cl.
*G02F 1/35* (2006.01)
*H01S 3/08* (2006.01)
(Continued)

(52) U.S. Cl.
CPC ............. *G02F 1/3526* (2013.01); *G02B 21/16* (2013.01); *G02F 1/37* (2013.01); *H01S 5/141* (2013.01); *H01S 5/183* (2013.01);
(Continued)

(58) Field of Classification Search
None
See application file for complete search history.

(56) References Cited

U.S. PATENT DOCUMENTS

2003/0169797 A1 *  9/2003  Aldaz ................. H01S 5/18388
372/96

(Continued)

OTHER PUBLICATIONS

Maas et al., "Vertical integration of ultrafast semiconductor lasers," Appl. Phys. B 88, 493-497 (2007).
(Continued)

*Primary Examiner* — Hemang Sanghavi
(74) *Attorney, Agent, or Firm* — RatnerPrestia

(57) ABSTRACT

A mode locked semiconductor disk laser with an output beam having an ultra-short pulse length which provides the incident beam to a non linear microscope. The wavelength of the beam is at or near the action cross section maximum absorption wavelength for creating two photon excited fluorescence of a fluorescent biological marker in a sample. Semiconductor disk lasers combine excellent beam quality and output power, stability while maintaining simplicity and easiness of operation. In addition, these types of lasers are ideally suited for mass production as they are built in wafer-scale technology enabling a high level of integration. Importantly this non expensive, turn-key, compact laser system could be used as a platform to develop portable non-linear bio-imaging devices for clinical studies, facilitating its wide-spread adoption in "real-life" applications.

25 Claims, 3 Drawing Sheets

(51) Int. Cl.
*G02B 21/16* (2006.01)
*H01S 5/14* (2006.01)
*H01S 5/183* (2006.01)
*G02F 1/37* (2006.01)
*H01S 3/081* (2006.01)
*H01S 3/11* (2006.01)

(52) U.S. Cl.
CPC ....... *G02B 2207/114* (2013.01); *H01S 3/0815* (2013.01); *H01S 3/1118* (2013.01)

(56) References Cited

U.S. PATENT DOCUMENTS

| | | | | |
|---|---|---|---|---|
| 2009/0237661 | A1* | 9/2009 | Yamazoe | G02B 21/06 356/364 |
| 2011/0044910 | A1* | 2/2011 | Lin | A61B 5/0059 424/9.6 |
| 2011/0233046 | A1* | 9/2011 | Nikolenko | G01N 21/6458 204/157.15 |
| 2012/0263196 | A1* | 10/2012 | Pask | H01S 3/30 372/3 |
| 2014/0058367 | A1* | 2/2014 | Dantus | H01S 3/005 606/6 |

OTHER PUBLICATIONS

Zhang et al., "A Picosecond Passively Mode-locked Vertical Extended Cavity Surface Emitting Diode Laser," International Symposium on Compound Semiconductors, Aug. 25-27, 2003, Piscataway NJ, USA, IEEE, Aug. 25, 2003, pp. 237-238.

Lorenser et al., "50-GHz Passively Mode-Locked Surface-Emitting Semiconductor Laser With 100-mW Average Output Power," IEEE Journal of Quantum Electronics, vol. 42, No. 8, Aug. 2006, pp. 838-847.

Taira et al., "Two-photon fluorescence imaging with a pulse source based on a 980-nm gain-switched laser diode," Optics Express, vol. 15, No. 5, Mar. 5, 2007, pp. 2454-2458.

Oheim et al., "Principles of two-photon excitation fluorescence microscopy and other nonlinear imaging approaches," Advanced Drug Delivery Reviews 58 (2006) pp. 788-808.

Aviles-Espinosa et al., "Compact ultrafast semiconductor disk laser for nonlinear imaging in living organisms," Proceedings of SPIE, Jan. 23, 2011, vol. 7903, pp. 79032T-1-79032T-7.

Aviles-Espinosa et al., "Portable semiconductor disk laser for in vivo tissue monitoring: a platform for the development of clinical applications," Proceedings of SPIE, May 24, 2011, vol. 8092, pp. 80920R-1-80920R-6.

International Search Report for PCT/GB2011/001361 mailed Dec. 27, 2011.

* cited by examiner

SEMICONDUCTOR DISK LASER FOR NONLINEAR MICROSCOPY APPLICATIONS IN LIVING ORGANISMS

This application is the U.S. National Phase Application of PCT/GB2011/001361, filed Sep. 19, 2011, which claims priority to Great Britain Application No. 1015565.3, filed Sep. 17, 2010, the contents of such applications being incorporated by reference herein.

INTRODUCTION

The present invention relates to a disk laser and in particular to a semiconductor disk laser suitable for nonlinear microscopy applications in living organisms.

BACKGROUND TO THE INVENTION

Nonlinear microscopy (NLM) techniques, such as Two Photon Excited Fluorescence (TPEF) and Second Harmonic Generation (SHG), are able to overcome some of the drawbacks present on conventional confocal laser scanning microscopy (CLSM). This is in part due to the fact that the nonlinear excitation is confined to a focused volume rather than the whole illuminated volume as it is the case for one photon fluorescence. Therefore photo toxicity and out of focus photo bleaching are considerably decreased. This confinement of light is advantageous since it allows optical sectioning of the sample, enabling the reconstruction of three dimensional (3D) models. In addition, nonlinear excitation normally relies on the use of excitation wavelengths in the near-infrared (NIR) range. At these wavelengths besides the fact that there is reduced photo damage, Rayleigh scattering is also decreased enabling larger penetration depths.

A key element in a nonlinear microscope is the use of an ultra-short pulsed (USP) laser. These are natural sources that are able to produce the required high intensities needed for exciting nonlinear processes. Historically, Ti:sapphire sources have been used in NLM due to its available large peak powers along with its large tunabilty range. However, its complexity, high price and maintenance requirements, have limited the widespread adoption of these powerful imaging techniques into "real-life" biomedical applications. Thus, efforts in the past have been concentrated in developing compact, cheap and easy to use USP lasers. However these sources have been limited by the available peak powers. More recently, the use of compact USP laser systems based on Chromium doped gain media such as Cr:LiCAF, Cr:LiSAF, Cr:LiSGAF in NLM and TPEF imaging has been demonstrated. However, these lasers have a limited tuning range constrained by the saturable Bragg reflector design.

Together with those, other alternative sources based on Fiber lasers and semiconductor laser diodes with amplification schemes have also been successfully presented as compact lasers for NLM applications. Fiber lasers can generate very short pulses via passive mode-locking, however, in terms of pulse duration, they can not use the full potential of the gain bandwidth as excessive nonlinearities and higher order chromatic dispersion are present in the fiber. In semiconductor lasers with amplification schemes (i.e. gain-switched laser source based on vertical cavity surface emitting lasers (VCSELs), gain-switched InGaAsP Distributed-Feedback-Bragg (DFB), laser diode and an external cavity mode-locked laser diode consisting of multiple quantum wells (AlGaAs)), the compactness of these systems is hampered by the need to include several stages to compress and/or amplify the pulses.

SUMMARY OF THE INVENTION

In accordance with a first aspect of the invention there is provided a mode locked semiconductor disk laser with an output beam having an ultra-short pulse length which provides the incident beam to a non linear microscope, wherein the wavelength of the beam is at or near the action cross section maximum absorption wavelength for creating two photon excited fluorescence of a fluorescent biological marker in a sample.

Semiconductor disk lasers combine excellent beam quality and output power, stability while maintaining simplicity and easiness of operation. In addition, these types of lasers are ideally suited for mass production as they are built in wafer-scale technology enabling a high level of integration.

Advantageously, because the laser output wavelength coincides with the two-photon action cross section maxima of the fluorescent biological marker, exciting the marker at this wavelength greatly relaxes the peak power conditions needed for TPEF-based imaging.

Preferably, the laser is mode-locked with a semiconductor saturable absorber mirror (SESAM).

Preferably, the laser is mode-locked with a quantum-dot semiconductor saturable absorber mirror (SESAM).

Preferably, the laser is mode-locked with a quantum-well semiconductor saturable absorber mirror (SESAM).

Preferably, the laser cavity is formed by a SESAM and a curved output coupling mirror which form the end-mirrors of the laser cavity.

Preferably, the laser is mode locked using a diamond heat spreader.

Preferably, the diamond heat spreader is wedge shaped and has an antireflection coating.

Preferably, the laser produces pulses of 1 to 2 picoseconds at 400 MHz to 600 Mhz.

More preferably, the laser produces pulses of 1.5 ps pulses at 500 MHz.

More preferably, the output average power of the 1.5 ps pulses at 500 MHz is 287 mW at 965 nm.

Preferably, the laser source can provide an input beam suitable for Two Photon Excitation Fluorescence (TPEF) imaging in a non-linear microscope.

Preferably, the laser source can provide an input beam suitable for Second Harmonic Generation (SHG) imaging in a non-linear microscope.

Preferably, the microscope comprises an X-Y scanning device used to scan the input beam over a sample.

Preferably, the laser source can provide an input beam suitable for Two Photon Excitation Fluorescence (TPEF) imaging and Second Harmonic Generation (SHG) imaging a non-linear microscope.

Preferably, the microscope can combine a Two Photon Excitation Fluorescence (TPEF) image with a Second Harmonic Generation (SHG) image.

Preferably, the microscope comprises a pair of x-y galvanometric mirrors (GM) used to scan the excitation beam over the sample.

Preferably, the microscope comprises a telescope for adjusting the fundamental beam diameter to fill the back aperture of the microscope objective.

Preferably, the microscope comprises a filter cube, containing a hot mirror.

Preferably, the microscope comprises a band pass filter for separating the excitation beam from the generated TPEF signal.

Preferably, the microscope comprises a forward detection mount with an attached photomultiplier tube (PMT)

Preferably, the microscope comprises a band pass filter to detect the SHG signal.

Preferably, the microscope comprises a PMT for detecting the TPEF signal.

Preferably the USP semiconductor disk laser is sized to be suitable for use in in vivo multiphoton microscopy.

In one example of the present invention the USP semiconductor disk laser has a size of 140×240×70 mm.

Preferably, the wavelength of the laser beam is at or near the action cross section maximum wavelength for creating two photon excited fluorescence of Green Fluorescent Protein (GFP).

Advantageously, the laser output wavelength brings the advantage that TPEF of the Green Fluorescent Protein (GFP), one of the most widely used fluorescent markers for biological applications, has its two-photon action cross section maxima around this operating wavelength of 965 nm. Exciting the GFP at this wavelength greatly relaxes the peak power conditions needed for TPEF-based imaging.

Alternatively, the wavelength of the laser beam is at or near the peak absorption wavelength for creating two photon excited fluorescence of one or more of the following fluorescent biological markers Di-8-ANEPPS in EtOH Fluo-3 (+Ca), Bodiphy (in water), Fluorescein (in water Ph=11). Alexa 488 (in water), Ca-Green, dsRed, eGFP, mVenus, YFP, mEGFP, mCitrine QDot 535.

In accordance with a second aspect of the invention there is provided a non linear microscope having a semiconductor disk laser in accordance with the first aspect of the invention.

Preferably, the microscope can combine a Two Photon Excitation Fluorescence (TPEF) image with a Second Harmonic Generation (SHG) image.

Preferably, the microscope comprises an X-Y scanning device used to to scan the input beam over a sample.

Preferably, the microscope comprises a pair of x-y galvanometric mirrors (GM) used to scan the excitation beam over the sample.

Preferably, the microscope comprises a telescope for adjusting the fundamental beam diameter to fill the back aperture of the microscope objective.

Preferably, the microscope comprises a filter cube, containing a hot mirror.

Preferably, the microscope comprises a band pass filter for separating the excitation beam from the generated TPEF signal.

Preferably, the microscope comprises a forward detection mount with an attached photomultiplier tube (PMT)

Preferably, the microscope comprises a band pass filter to detect the SHG signal.

Preferably, the microscope comprises a PMT for detecting the TPEF signal.

Ultrashort means nanosecond or shorter. It is envisaged that examples of the present invention will have the capability to provide pulses with a duration of the order of picoseconds or shorter.

BRIEF DESCRIPTION OF THE DRAWINGS

The present invention will be described by way of example with reference to the accompanying drawings in which.

DETAILED DESCRIPTION OF THE DRAWINGS

The use of the semiconductor disk laser of the present invention as part of a non-linear microscope to obtain TPEF of Green Fluorescent Protein, in this example, is demonstrated in vivo for two different *C. elegans* strains genetically modified to express GFP in motorneurons and muscle cells. In addition, the extended versatility of the laser is shown by presenting second-harmonic generation (SHG) images of uterus and body wall muscles. It will be appreciated that the present invention as defined herein need not include SHG and the SHG functionality shown in FIG. 1 need not be implemented.

Figure 1:
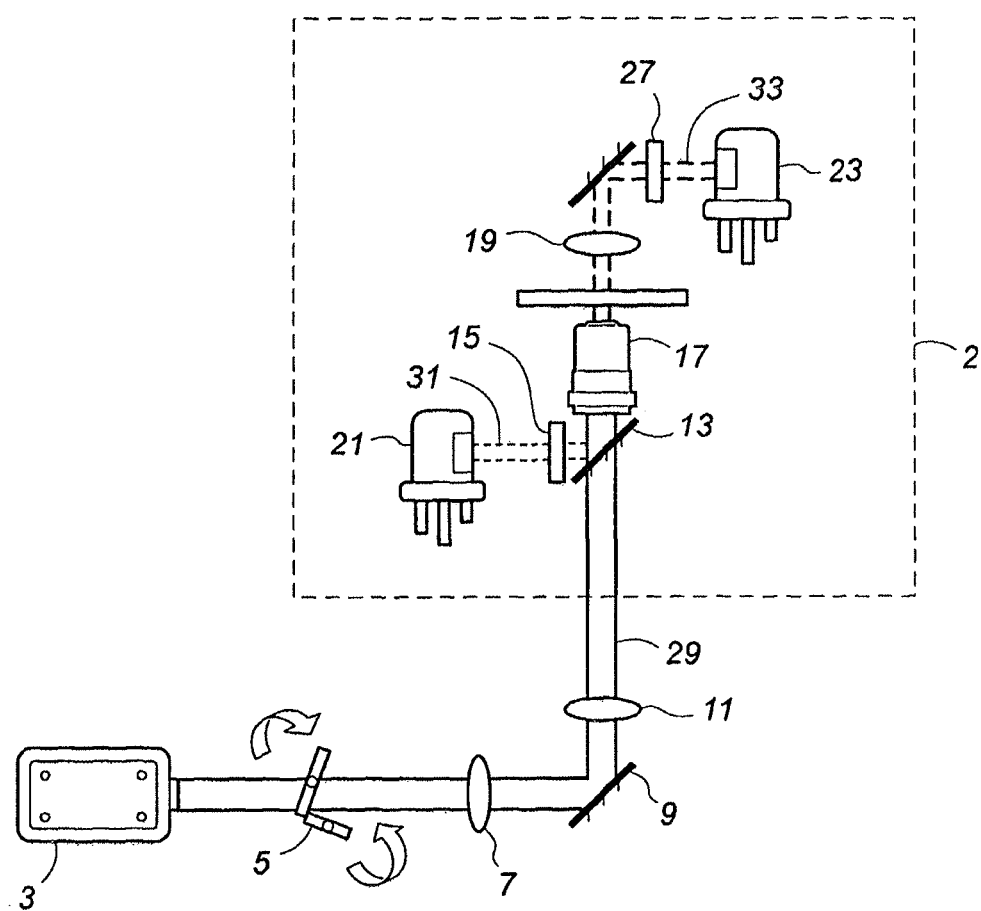
FIG. 1. Is a schematic representation of an apparatus in accordance with the present invention.

The example of FIG. 1 is based on an inverted microscope (Nikon, Eclipse TE 2000U) modified to work as a laser scanning nonlinear microscope 2. The path 29 of the fundamental excitation beam centered at 965 nm is shown with solid lines, the path 31 to the SHG emission is shown with shorter dashed lines and the green path 33 to the TPEF emission is shown in longer dashed lines. Lenses are denoted by reference numerals 7 and 11. The galvanometric mirror (GM) is denoted by reference numeral 5. The objective lens (OL) is denoted by reference numeral 17 and has magnification 40×, and a numerical aperture NA=1.3. The condenser optics (CO) 19 has NA=1.4 F1 and F2 are the band pass filters (F1 15 transmittance=330-670 nm and F2 27 transmittance=475-485 nm). Photomultiplier tubes 21 and 23 (PMT), Mirror 9 and dichroic mirror 13 are also shown.

In this example of the present invention, the semiconductor disk laser 3 operates at a central wavelength of 965 nm and has a pulse duration of 1.5 ps and a repetition rate of 500 MHz. The laser source geometry is a V-shaped cavity mounted over a heat sink spreader. The pump beam of this laser is focused at an angle of 45 degrees towards the vertical cavity surface emitting laser (VECSEL). A quantum-dot SESAM and a curved output coupling mirror form the end-mirrors of the laser cavity. To operate this laser a web-based interface accessed through a PC was used to switch on the laser emission. The delivered output average power is of 287 mW corresponding to 0.4 KW peak power. The transmission of our microscope at this wavelength is of 13%. Mode locking in this and other examples of the present invention may be improved by using a wedged antireflection (AR) coated diamond heat spreader.

The microscope is equipped with a pair of x-y galvanometric mirrors 5 (GM) used to scan the excitation beam over the sample. A telescope was used to adjust the fundamental beam diameter to fill the back aperture of the microscope objective. A filter cube, containing a hot mirror (Semrock, Inc., FF670-SDi01 transmittance=360 nm-650 nm reflectance=680 nm 1080 nm) and a BG39 band pass filter to separate the excitation beam 33 from the generated TPEF signal 29. A 40× oil immersion microscope objective lens 17 with NA=1.3, was used during the experiments. The SHG signal was collected by an oil immersion condenser 19 NA=1.4. A custom made forward detection mount with an attached photomultiplier tube (PMT) 23, and a band pass filter 27 (transmittance=475-485 nm) was employed to detect the SHG signal. To detect the TPEF signal a PMT 21, was mounted on one of the microscope ports. A custom made interface was used to control both scanning units and the data acquisition card.

The acquired images were volume rendered to allow for 3D reconstruction employing suitable image processing and analysis software such as Image J software. This procedure was repeated for different samples for a further 3D reconstruction and analysis.

Two strains of *Caenorhabditis elegans* (*C. elegans*) expressing GFP were used to perform the imaging experiments. Its transparency and easiness of lab maintenance make this model organism highly attractive for microscopy studies. Both *C. elegans* strains were grown in nematode growth media and feed with OP50 (*Escherichia coli*). They were anesthetized using 0.8 μl of 25-mM sodium azide (NaN$_3$) and mounted on a 2% agar pad sandwiched between two cover glasses (No. 1—0.13 to 0.16 mm). The preparations were sealed using melted paraffin and were imaged at room temperature (20° C.).

The semiconductor disk laser was used to image two different living *C. elegans* nematodes strains expressing GFP in different cell structures. In order to demonstrate the imaging capabilities of the semiconductor disk laser, all the TPEF GFP images where simultaneously recorded with any SHG signal that could be originated from the strains. The imaging of both strains was performed employing an average power of 34 mW (measured at the sample plane) which corresponds to a peak power of ~0.04 KW. Employing this configuration, no damage at the sample was observed. In our setup, the peak power threshold for getting a TPEF image from GFP was ~0.01 KW.

The first strain to be imaged was an adult *C. elegans* nematode expressing GFP in different muscle cell nuclei. In particular we imaged the vulval region of the nematode. The results are shown in FIG. 2.

Figure 2A:
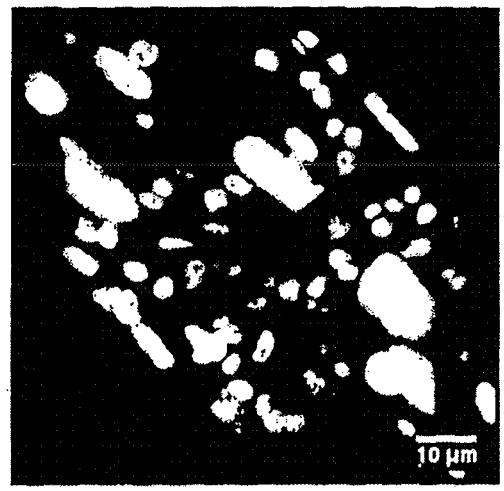
FIG. 2a is a black and white representation of a colour 3D projection of a TPEF signal from the muscle cells nuclei expressing GFP (light shaded areas against black background, FIG. 2b is a black and white representation of a colour 3D projection of SHG signal of muscles in the vulval region (light shaded areas against black background in a *C. elegans*.
Figure 2B:
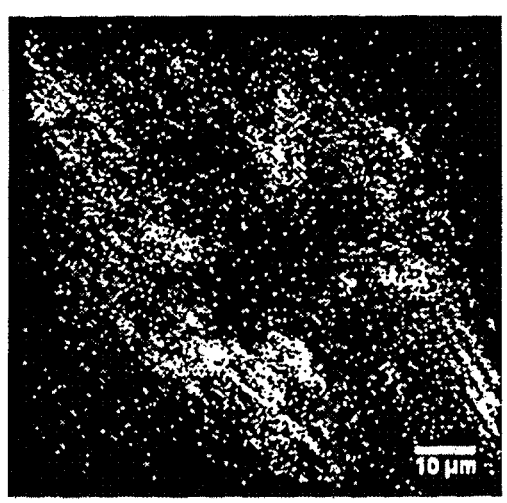
FIG. 2c is a black and white representation of a colour 3 D projection of the merged images of FIG. 2a and FIG. 2b.
Figure 2C:
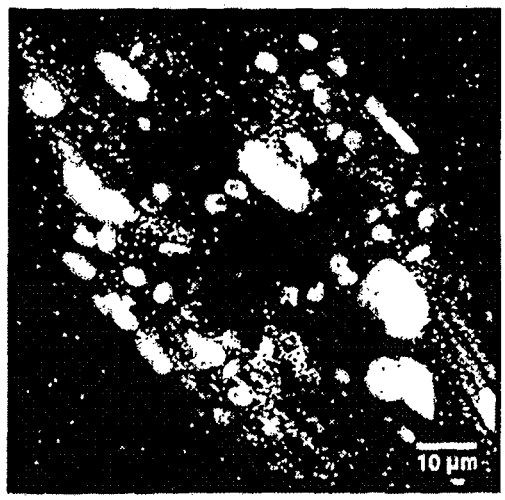

In FIGS. 2a, 2b and 2c, the 3D projection is composed of 55 stacks separated 1 μm. A single XY optical section was taken in less than 2 seconds. For the SHG image an average of 10 frames was applied to improve the signal to noise ratio. All the images are 500×500 pixels FIG. 2a, shows the 3D projection of GFP tagged muscle cells nuclei (rounded areas of light shading). From this image, (*C. elegans* positioned ventrally) all the labeled nuclei from all the cells that compose the worm's vulva are visible and clearly identified. The central image of FIG. 2b (SHG signal) shows two different types of muscles (linear areas of light shading), these are the nonstriated muscle organization in the vulval region and the striated sarcomeric actin filaments of the body wall muscles. Mapping TPEF and SHG signals (FIG. 2c) combines the rounded and linear areas of light shading and enables the observation of how the body muscle cells form a lattice, which is adjacent to the vulval muscles showing the clear location of these muscular cell nuclei. Moreover, as these images were reconstructed in a 3D projection, the exact location of these cells, forming the worms vulval region, can be mapped.

To further demonstrate the capabilities of this laser we then proceeded to image an adult *C. elegans* nematode expressing GFP in the motoneurons (see FIG. 3).

Figure 3A:
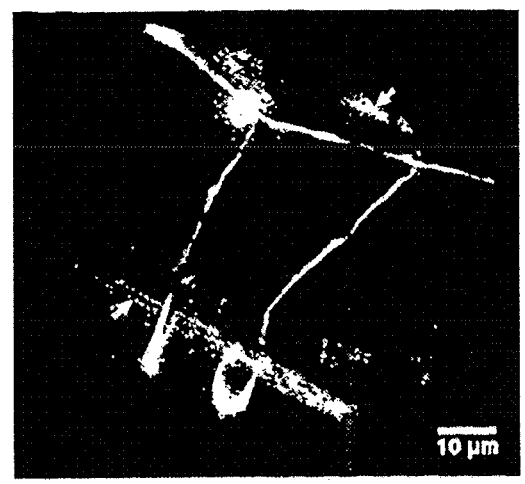
FIG. 3a is a black and white representation of a colour 3D projection of TPEF (lines of light shading) motorneurons expressing GFP marker, FIG. 3b is a black and white representation of a colour 3D projection of SHG (clustered areas of light shading) signal of the muscles in the vulval region in a *C. elegans* mid body region and FIG. 3c is a black and white representation of a colour 3D projection of the merged images of 3a and 3b.
Figure 3B:
Figure 3C:
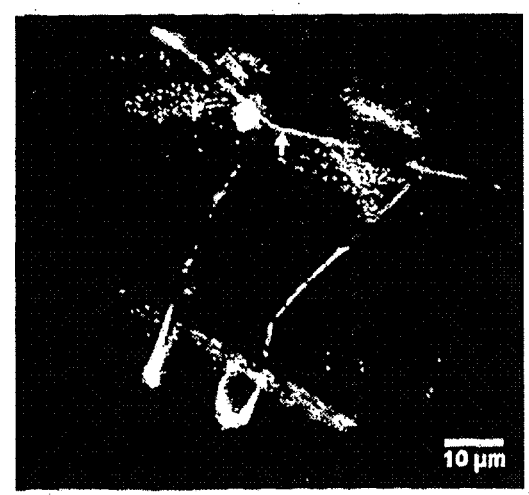

In FIGS. 3a, 3b and 3c the 3D projection is composed of 50 stacks separated 1 μm. A single XY optical section was taken in less than 2 seconds. For the SHG image an average of 10 frames was applied to improve the signal to noise ratio. All the images are 500×500 pixels.

FIG. 3a shows a set of VD type motoneurons expressing GFP (vertically running). On the upper part of image 3a, the ventral nerve cord and motoneurons cell bodies (near the vulva) can be clearly observed (bright spot at the top end of the image). Additionally in the same image on the lower and upper parts, an epi-detected SHG signal or autofluorescence from body wall and vulva muscles is observed (see the white arrows in FIG. 3a).

In panel 3b, the vulval muscles (the *C. elegans* is laterally positioned) can be observed together with an motoneuron cell body (bright spot A). This spot could be due to autofluorescence leaking through the filter or SHG emission of the same VD motoneuron observed in FIG. 3a. These types of signals can appear when a chromophore having a large induced dipole is asymmetrically bound with a membrane, therefore lipids and proteins can be selectively observed in an SHG image. The superposition of both signals enables the observation of the vm-type 1 and 2 vulval and body wall muscles in close relation with the motoneurons that are responsible of the body wall muscles locomotion.

Based on both imaged strains, we observe a very bright TPEF signal despite the fact that we are using a very low peak power. This is because the employed wavelength is located around GFP maximum of its two-photon action cross section. Therefore, having this reduced light reaching the sample relaxes the large required intensities to excite GFP and maximizes sample viability given that the ratio of the energy absorbed to the input energy flux determines the possible induced sample damage. It should be noted that this light dosage corresponds to approximately 2% of the commonly employed peak powers (twice the average powers) typically used to excite this protein employing a Ti:Sappire laser.

Because of the nonlinear regime in which this laser operates, all the inherent advantages are expected. These are larger penetration depths, enhanced signal to noise collection, less absorption of intrinsic tissue molecules, reduced production of auto fluorescence from endogenous molecules due to the use of longer wavelengths, and slower photobleaching rates (compared with CLSM). This has been reported to be ten times slower employing the same excitation rate).

The use of this laser for TPEF imaging is not only restricted to GFP labeled specimens. In table 1 the two-photon action cross-section relative to GFP at 965 nm for different markers is estimated. This table further shows the great potential application of the present invention for use with different commonly used fluorescent markers.

TABLE 1

Two-photon action cross sections of different biological markers

| Fluorescent Dye | Expected signal compared to GF cross section |
| --- | --- |
| Di-8-ANEPPS in EtOH | 0.03 |
| Fluo-3 (+Ca) | 0.04 |
| Bodiphy (in water) | 0.05 |
| Fluorescein (in water Ph = 1) | 0.06 |
| Alexa 488 (in water) | 0.20 |
| Ca-Green | 0.26 |

TABLE 1-continued

Two-photon action cross sections of different biological markers

| Fluorescent Dye | Expected signal compared to GF cross section |
|---|---|
| dsRed | 0.47 |
| eGFP | 1.00 |
| mVenus | 1.00 |
| YFP | 1.15 |
| mEGFP | 1.50 |
| mCitrine | 1.54 |
| QDot 535 | >>1 |

Alternative applications in which the laser can be used targeting GFP as a genetically encoded fluorescent sensor are: monitoring membrane potentials to study electrophysiological processes in living organisms, characterization of retinal circuits via the photopic light responses and dendritic morphologies of GFP expressing neurons, recording of pH changes inside specific structures of living samples, and protein dynamics recording inside living cells through photobleaching experiments among others.

The present invention demonstrates the use of a semiconductor ultra-short pulsed disk laser, for nonlinear imaging of specimens labeled with a suitable fluorescent dye For example living C. elegans samples expressing GFP, one of the most widely used fluorescent markers.

Advantageously, the use of a semiconductor ultra-short pulsed disk laser allows the creation of a compact design. In one example, this has a footprint of only 140×240×70 mm. In addition the present invention combines simple and maintenance free operation as no alignment, cleaning or specialized knowledge is required to operate this laser. Its novel mode-locking mechanism, enables the laser to have a self-starting pulsed output immediately after the laser is switched on. In the above example, the mode locking mechanism is based on a quantum-dot semiconductor saturable absorber mirror, The operating wavelength described above centered at 965 nm, offers several benefits. Besides inheriting all the advantages of NLM, this laser enables a very efficient TPEF signal excitation as the GFP two-photon action cross section maxima falls around this operating wavelength. This results in extremely efficient generation of images with a very small light dose (~0.04 KW peak power) which would be important for preserving the sample viability. This is demonstrated by presenting in-vivo TPEF images of C. elegans worms expressing GFP in motoneurons and muscle cells. This advantage is potentially shared by other markers, with similar or superior two-photon action cross section.

As the laser of the present invention operates in the nonlinear regime the enhanced signal to noise collection enables to have larger penetration depths, reduced production of auto fluorescence from endogenous molecules and slower photobleaching rates compared to CLSM.

The extended versatility of the laser is demonstrated by presenting SHG images of uterus and body wall muscles. Given this, the employed laser source has the potential to cover a wide range of biological applications based on GFP marking.

The above embodiment of the present invention demonstrates the suitability of a compact ultrafast mode locked semiconductor disk laser source, to be used for nonlinear microscopy applications. The laser may be mode locked using a quantum-dot semiconductor saturable absorber mirror (SESAM). It delivers an average output power of 287 mW with 1.5 ps pulses at 500 MHz. The laser central wavelength (965 nm) falls around the peak of the two photon action cross section of the widely used Green Fluorescent Protein (GFP).

The present invention has large potential for Two Photon Excitation Fluorescence (TPEF) imaging. This is demonstrated by its use with two important examples of GFP-labeled tissue components in living C. elegans nematodes: neuronal cells and muscle cell nuclei. In addition, the extended versatility of the laser is shown by presenting Second Harmonic Generation (SHG) images of uterus and body wall muscles. Importantly this non expensive, turn-key, compact laser system could be used as a platform to develop portable nonlinear bio-imaging devices for clinical studies, facilitating its wide-spread adoption in "real-life" applications.

Improvements and modifications may be incorporated herein without deviating from the scope of the invention.

The invention claimed is:

1. A non-linear microscope with an incident beam which comprises a mode locked semiconductor disk laser having an ultra-short pulse length, wherein a wavelength of the laser beam is at or near an action cross section maximum wavelength for creating two photon excited fluorescence of a fluorescing biological marker in a sample wherein, the laser produces pulses of less than 2 picoseconds at repetition rates of less than 1 GHz and the laser is mode-locked with a quantum-dot semiconductor saturable absorber mirror (SESAM).

2. A non-linear microscope as claimed in claim 1 wherein, the laser is mode-locked with a semiconductor saturable absorber mirror (SESAM).

3. A non-linear microscope as claimed in claim 2 wherein the laser is mode-locked with a quantum-well semiconductor saturable absorber mirror (SESAM).

4. A non-linear microscope as claimed in claim 1 wherein, the laser has a cavity which is formed by a SESAM and a curved output coupling mirror which form end-mirrors of the cavity of the laser.

5. A non-linear microscope as claimed in claim 1 wherein the laser is mode locked using a diamond heat spreader.

6. A non-linear microscope as claimed in claim 5 wherein the diamond heat spreader is wedge shaped and has an antireflection coating.

7. A non-linear microscope as claimed in claim 1 wherein, the laser produces pulses of 1.5 ps pulses at a repetition rates of 500 MHz.

8. A non-linear microscope as claimed in claim 7 wherein, the output average power of the 1.5 ps pulses at 500 MHz is 287 mW at 965 nm.

9. A non-linear microscope as claimed in claim 1 wherein, the laser source can provide an input beam for Second Harmonic Generation (SHG) imaging a non-linear microscope.

10. A non-linear microscope as claimed in claim 9 wherein a Two Photon Excitation Fluorescence (TPEF) image and a Second Harmonic Generation (SHG) image can be viewed in combination.

11. A non-linear microscope as claimed in claim 10 wherein the microscope comprises an X-Y scanning device used to scan the input beam over a sample.

12. A non-linear microscope as claimed in claim 10 wherein, the microscope comprises a pair of x-y galvanometric mirrors (GM) used to scan the input beam over a sample.

13. A non-linear microscope as claimed in claim 1 wherein, the microscope comprises a telescope for adjusting a fundamental beam diameter to fill a back aperture of a microscope objective.

14. A non-linear microscope as claimed in claim 10 wherein, the microscope comprises a filter cube, containing a hot mirror.

15. A non-linear microscope as claimed in claim 10 wherein, the microscope comprises a band pass filter for separating an excitation beam from a generated TPEF signal.

16. A non-linear microscope as claimed in claim 10 wherein, the microscope comprises a forward detection mount with an attached photomultiplier tube (PMT).

17. A non-linear microscope as claimed in claim 10 wherein, the microscope comprises a band pass filter to detect an SHG signal.

18. A non-linear microscope as claimed in claim 1 wherein the mode locked semiconductor disk laser has a volume of less than 8000 cm$^2$.

19. A non-linear microscope as claimed in claim 1 wherein the wavelength of the laser beam is at or near the peak absorption wavelength for creating two photon excited fluorescence of Green Fluorescent Protein (GFP).

20. A non-linear microscope as claimed in claim 1 wherein the wavelength of the laser beam is at or near the peak absorption wavelength for creating two photon excited fluorescence of one or more of the following fluorescing biological markers Di-8-ANEPPS in EtOH Fluo-3 (+Ca), 'Bodiphy (in water), Fluorescein (in water Ph=11), Alexa 488 (in water), Ca-Green, dsRed, eGFP, mVenus, YFP, mEGFP, mCitrine' QDot 535.

21. A non-linear microscope as claimed in claim 1 wherein, the microscope comprises a telescope for adjusting a fundamental beam diameter to fill a back aperture of a microscope objective.

22. A non-linear microscope as claimed in claim 1 wherein, the microscope comprises a filter cube, containing a hot mirror.

23. A non-linear microscope as claimed in claim 1 wherein, the microscope comprises a band pass filter for separating an excitation beam from a generated TPEF signal.

24. A non-linear microscope as claimed in claim 1 wherein, the microscope comprises a forward detection mount with an attached photomultiplier tube (PMT).

25. A non-linear microscope as claimed in claim 1 wherein, the microscope comprises a band pass filter to detect an SHG signal.

\* \* \* \* \*